(12) United States Patent
Lee et al.

(10) Patent No.: US 7,008,879 B2
(45) Date of Patent: Mar. 7, 2006

(54) ISOLATION CHAMBER ARRANGEMENT FOR SERIAL PROCESSING OF SEMICONDUCTOR WAFERS FOR THE ELECTRONIC INDUSTRY

(75) Inventors: Chunghsin Lee, Lynnfield, MA (US); Jian Zhang, Brookline, MA (US); Darren M Simonelli, Seabrook, NH (US); Keith D. Mullins, Plaistow, NH (US); David A. Wassen, Andover, MA (US)

(73) Assignee: Semigear, Inc., Wakefield, MA (US)

( * ) Notice: Subject to any disclaimer, the term of this patent is extended or adjusted under 35 U.S.C. 154(b) by 0 days.

(21) Appl. No.: 10/832,782

(22) Filed: Apr. 27, 2004

(65) Prior Publication Data

US 2004/0203178 A1    Oct. 14, 2004

Related U.S. Application Data

(62) Division of application No. 10/186,823, filed on Jul. 1, 2002, now Pat. No. 6,827,789.

(51) Int. Cl.
*H01L 21/30* (2006.01)
(52) U.S. Cl. ............... 438/758; 438/800; 414/935; 414/939
(58) Field of Classification Search ............ 414/939, 414/935; 438/908, 907, 800, 758
See application file for complete search history.

(56) References Cited

U.S. PATENT DOCUMENTS 5,855,465 A * 1/1999 Boitnott et al. ........ 414/331.18
6,827,789 B1 * 12/2004 Lee et al. ................. 118/719

* cited by examiner

Primary Examiner—Alexander Ghyka
(74) Attorney, Agent, or Firm—Don Halgren

(57) ABSTRACT

An apparatus for the treatment of semiconductor wafers, comprising a supportive frame and a process table arranged on the supportive frame. The process table comprises a stationary upper platen and a stationary lower plate. An intermediate indexing plate is rotatively arranged between the upper platen and the lower plate. At least one wafer support pin is attached to the indexing plate for the support of a wafer by the indexing plate. An upper housing is arranged on the upper platen and an outer lower housing is arranged on the lower plate. A displacable lower isolation chamber is disposed within the outer lower housing, being displacable against the indexing plate to define a treatment module between the upper housing and the lower isolation chamber in which the wafer is treated. A wafer supporting treatment plate is arranged within the lower isolation chamber, for controlled rapid treatment of a wafer within the treatment module.

13 Claims, 5 Drawing Sheets

ISOLATION CHAMBER ARRANGEMENT FOR SERIAL PROCESSING OF SEMICONDUCTOR WAFERS FOR THE ELECTRONIC INDUSTRY

This is a divisional application of U.S. patent application Ser. No. 10/186,823, filed Jul. 1, 2002 now U.S. Pat. No. 6,827,789, which is incorporated herein by reference.

BACKGROUND OF THE INVENTION

1. Field of the Invention

This invention relates to apparatus and methods for the treatment and processing of semiconductor wafers.

2. Prior Art

Semiconductor wafers are utilized in the modern electronics industry for the production of very large scale integrated (VLSI) circuits and Ultra Large Scale Integrated (UlSI) circuits and chips and the like. Such semiconductor wafers must go through a wide variety of high manufacturing standards steps in order to produce a perfect semiconductor product.

During that production process, the wafers must be treated by a series of sequential steps. The processing of these wafers may include oxidation, ion implantation, thermal annealing, deposition, etching, passivation and packaging. The thermal annealing and solder reflow may be some of the most important steps in VLSI/ULSI. Some prior art processing operations may include the use of a continuous drive belt through a furnace heating and a cooling zones. Such a system, however, requires large clean rooms, and they operate under expensive operating conditions. Other prior art processing may be done on semiconductor wafers in a batch process. Uniformity and consistency of a product is difficult to maintain or achieve in these processes. Such prior art operations in either a belt or batch process are also often very expensive and very complicated.

It is an object of the present invention to overcome the disadvantages of the prior art.

It is a further object of the present invention to provide a wafer processing operation which simplifies the automation needed to effectively and efficiently handle and treat a semiconductor wafer.

It is still a further object of the present invention to provide a semiconductor wafer processing arrangement which minimizes the equipment size required for this operation.

It is yet a still further object of the present invention to provide a wafer processing arrangement which minimizes the cost of such wafer processing.

It is still yet a further object of the present invention to provide an apparatus for the continuous treatment of semiconductor wafers in a clean and controllable manner not found in the prior art.

BRIEF SUMMARY OF THE INVENTION

The present invention relates to a wafer processing arrangement for the sequential isolated treatment of semiconductor wafers. The processing arrangement comprises a frame support for a wafer process table and a wafer feed and removal robot arrangement thereadjacent. The wafer process table comprises a plurality of housing covers each positioned on a stationary upper plate as part of a treatment module for each position in the process of treatment of the semiconductor wafers.

The wafer process table includes a stationary lower housing platen surrounding a central transmission drive unit which indexes an indexable rotary index plate between a plurality of treatment modules through the sequential steps in the treatment process at the wafer process table.

Each step in the process is accomplished as the intermediately disposed rotary index plate rotatively indexes through a series of positions, which positions register with the upper plate and the housing covers associated therewith, and the stationary lower housing platen with its respective treatment modules.

The stationary lower plate includes for each position in the process, an opening therethrough with a lower portion of the processing or treatment module thereattached. The processing module attached to the lower side of the stationary lower plate consists of a lower cup or housing. The lower housing has an upper edge defined by an annular lip which is secured to the periphery of its respective opening in the lower plate of the process table. The lower plate and lower housing is stationary with respect to the upper plate of the process table and frame.

The intermediate rotary indexing plate is arranged between the upper plate of the process table and the lower plate supporting the outer lower cup shaped housing at each processing module therearound. The rotary indexing plate has spaced apart openings on which a vertically liftable annular wafer ring is disposed. Each vertically liftable annular wafer ring has a plurality of circumferentially spaced openings therethrough to provide a fluid communication between the stationary upper chamber at each processing module and the outer lower housing of each processing module. Each wafer ring has at least three radially inwardly directed wafer support pins extending therefrom. Each wafer pin has a radially inwardly directed shoulder. As the rotary index plate advances rotationally from treatment module to treatment module in sequence around the wafer processing table, a robotic arm loads and unloads a semiconducter wafer at the particular loading and unloading station in the sequence. The wafer is placed upon the upper side of the shoulder of the wafer support pins which extend radially inwardly from the inner edge of the wafer ring. The shoulders on the pins provides lateral control to a wafer supported on those pins as the index plate is rotated.

Each processing module location has a lower support housing associated therewith. The lower support housing includes a support column extending therethrough. A wafer treatment plate is arranged on the upper end of the support column extending through the support housing. The treatment plate is arranged within a vertically displacable isolation chamber. The support column moves the isolation chamber and the treatment plate arranged therewithin, into vertical supportive contact with a semiconductor wafer held by the wafer support pins extending radially inwardly from the wafer ring supported on the indexing plate. The treatment plate, preferably of circular configuration, has a corresponding radially inwardly directed grooves arranged therein, for spaced enclosive receipt of the radially inwardly directed wafer support pins. As the treatment plate is moved vertically upwardly, it contacts and lifts the wafer slightly away from the wafer support pins to permit full engagement of the treatment plate with respect to the wafer support pins.

During this part of the process, the isolation chamber, which has an O ring around its upper peripheral edge, engages the lower side of the wafer ring. The lower peripheral edge of the inverted upper chamber has an O ring therearound. As the treatment plate is driven upwardly, the rising lower chamber lifts the wafer support ring slightly and presses the upper side of the wafer ring against the lower periphery of the housing cover or stationary upper chamber to define an isolation chamber therebetween which is thus formed between the stationary upper chamber and the upwardly movable isolation housing.

The treatment plate may comprise heating elements therewith, or cooling elements, therewith, so as to touchingly engage and more rapidly heat the semiconductor wafer thereon or touchingly engage and more rapidly chill that semiconductor thereon depending upon which position that particular semiconductor wafer is at in the process table.

A treatment port may be arranged through the stationary upper housing, to provide a vacuum to the isolation chamber, or to provide a chemical vapor deposition (CVD) or a physical vapor deposition (PVD), an RF generator, or a plasma therethrough or a combination thereof for treatment of that particular semiconductor wafer at that particular module in the apparatus.

The support housing beneath the outer lower housing may include a bellows to permit the longitudinal advancement and withdrawal of the support column of the housing while maintaining the ambient relationship within the isolation chamber. A treatment plate and isolation housing lift and retraction mechanism is also arranged within the support housing to provide the vertical advance and vertical withdrawal of the treatment plate from a semiconductor wafer supported on the wafer support pins on the wafer ring. A vacuum and/or sensors may extend through one or more of the support housings to provide suction to a wafer on the plate for holding purposes. Sensors may provide temperature information about the wafer and or the wafer thereon. Indexed rotational movement of the rotatable index plate advances subsequent semiconductor wafers to each respective treatment module for sequential treatment as that index plate is rotated about its central axis. The robotic loading and unloading of semiconductor wafers occurs from a radially outwardly disposed location with respect to the process table. This peripherally disposed wafer manipulation, instead of from a center of table location, permits simpler indexing mechanism and greatly simplifies the loading and unloading of the semiconductor wafers at that particular loading and unloading module location in the sequence at the process table.

The treatment plate has a radially directed channel spaced at least partially thereacross. The depth of the channel in the treatment plate is greater than the depth of the grooves for accommodating the wafer support pins thereon. This permits the robotic loading and unloading arm to move or remove a wafer onto the radially newly directed support pins and then subsequently downwardly therefrom to permit the support of that wafer on those support pins without disturbing that semiconductor wafer and without engaging the treatment plate.

Thus what has been shown is an apparatus for the serial processing of semiconductor wafers from an initial loading of an indexable rotatable plate through a circumferential arrangement of locations at separate treatment modules thus through an unloading operation of that semiconductor wafer after its treatment process. Each independent treatment module effects an isolation chamber processing to permit ambient conditions to be effected upon that semiconductor wafer at that particular location in the process table. By this stepped indexing and complete isolation as each individual wafer is individually processed, treatment times may be minimized and treatment effectiveness may be maximized and equipment costs may be reduced due to the simplicity of the operational features of the present apparatus.

The invention thus comprises an apparatus for the treatment of semiconductor wafers, comprising: a supportive frame and a process table arranged on the supportive frame, the process table comprising a stationary upper platen and a stationary lower plate; an intermediate indexing plate rotatively arranged between the upper platen and the lower plate; a wafer support pin attached to the indexing plate for the support of a wafer by the indexing plate; an upper housing arranged on the upper platen and an outer lower housing arranged on the lower plate; and a displacable lower isolation chamber disposed within the outer lower housing, displacable against the indexing plate to define a treatment module between said upper housing and the lower isolation chamber in which the wafer is treated. The apparatus includes a wafer supporting treatment plate arranged within the lower isolation chamber, for controlled rapid treatment of a wafer within the treatment module. The treatment plate may have a heating element therein. The treatment plate may have a cooling element therein. The process table may have a plurality of treatment modules arranged circumferentially therearound. The wafer support ring may be vertically displacable with respect to the indexing plate, to permit a tight seal to be arranged between the lower isolation chamber, the wafer support ring and the upper housing. The treatment plate may have a vacuum line arranged therein to permit a wafer carrier thereon to be suctioned against the treatment plate during a treatment process. The upper housing may have a treatment port arranged therethrough to permit a wafer supported therebelow to be treated by a treatment selected from the group consisting of: chemical vapor deposition, physical vapor deposition, ion implantation, plasma enhanced chemical vapor deposition, and radio frequency radiation.

The treatment plate may have a plurality of grooves arranged on an upper surface thereof to permit the upper surface of the treatment plate to be raised above the level of the pins. At least one of the grooves may comprise a channel for the receipt of a robotic arm therein. At least one of the grooves is deeper than the remainder of the grooves in the treatment plate. A controllably movable support column may be arranged through the lower housing to permit the treatment plate and the lower isolation chamber to be vertically displaced. The upper housing and the lower isolation chamber form a wafer treatment module when the lower isolation chamber is raised against a lower side of the indexing plate. A portion of the indexing plate adjacent the wafer may be supported thereon by a wafer ring, and wherein the wafer ring may include the radially inwardly directed wafer support pins. The wafer support ring may have a plurality of openings spaced circumferentially therearound to permit fluid communication between the upper housing and the lower isolation chamber.

The invention may also include a method of preparing semiconductor wafers, comprising the steps of: arranging a stationary upper platen and a stationary lower plate on a frame, with the upper platen having a plurality of upper housings spaced circumferentially therearound, and the lower plate having a corresponding plurality of lower housings spaced circumferentially therearound; rotatively supporting an indexable plate between the upper platen and the lower plate; loading a wafer to be treated onto an arrangement of support pins extending at least part way across the opening on the indexable plate; rotating the indexable plate between the upper platen and the lower plate for successive treatment process locations for treatment of the wafer; and isolating the wafer on the index plate at each treatment location for independent controlled access and treatment of the wafer thereat.

The method may include the steps of: lifting a treatment plate into direct supportive contact with the wafer to begin a step in the treatment of the wafer; arranging a plurality of grooves on the treatment plate to permit the pins to be received therewithin, to allow the wafer to be supportively touched by the treatment plate; arranging a lower isolation chamber within each of the lower housings; moving the lower isolation chamber with respect to the lower housing to define an isolated treatment module between the upper housing and the lower housing; moving the treatment plate and the lower isolation chamber simultaneously to initiate treatment of a wafer supported on the pins; heating the wafer in the isolated treatment module after the wafer has been lifted from the pins; chilling the wafer in the isolated treatment module after the wafer has been lifted from the pins; introducing a further treatment to the wafer at a successive isolated treatment module after the treatment plate has been lowered from support of the wafer and the index plate has been rotated to a subsequent position between the stationary upper platen and the stationary lower plate.

The invention may also include a method of preparing semiconductor wafers comprising one or more of the following steps of: rotating a wafer bearing indexing plate into alignment between an upper housing on a stationary upper platen and a lower housing on a stationary lower plate; lifting a treatment plate into supportive engagement with the wafer borne by the indexing plate; and isolating the wafer to provide an individual sealed containment thereof during a treatment process applied to the wafer; loading the wafer onto the indexing plate by a robotic arm arranged radially outwardly of the indexing plate, to minimize the complexity of such loading; arranging an opening on the indexing plate for receipt of the wafer; placing a plurality of radially directed pins on the periphery of the opening, to enable the pins to support the wafer during rotation of the indexing plate; forming grooves on an upper surface of the treatment plate to permit the pins to be received therein to allow the treatment plate to directly touch and support the wafer during treatment thereof; enclosing the treatment plate in a displacable lower isolation chamber; and moving the lower isolation chamber into sealing engagement with the indexing plate as the treatment plate is lifted into supportive engagement with the wafer; placing a wafer ring onto the indexing plate to support the wafer on the indexing plate; and arranging a plurality of radially directed pins on the wafer ring to support the wafer within the wafer support ring; lifting the wafer support ring from the indexing plate to properly engage the wafer by the treatment plate.

The invention may also include a semiconductor serial-processing table comprising: a movable indexing plate supported between a stationary upper plate and a stationary lower plate, the upper and lower plates each having a plurality of housings opposing one another, each of the opposed housings defining a wafer treatment module therebeween. A vertically displacable treatment plate may be arranged within each of the opposed housings arranged to support a wafer for treament thereon; the indexing plate may include a plurality of openings therethrough in vertical alignment with the opposed housings on the upper and lower plates, to permit a wafer to be arranged therewithin. A liftable wafer ring may be arranged within each of the openings in the indexing plate to permit the upper and lower opposed housings to define an isolation chamber. The lower housings may be vertically displacable with respect to the lower plate. The lower housing may include an outer lower housing secured to the lower plate.

BRIEF DESCRIPTION OF THE DRAWINGS

The objects and advantages of the present invention will become more apparent when viewed in conjunction with the following drawings, in which.

DETAILED DESCRIPTION OF THE PREFERRED EMBODIMENTS

Figure 1:
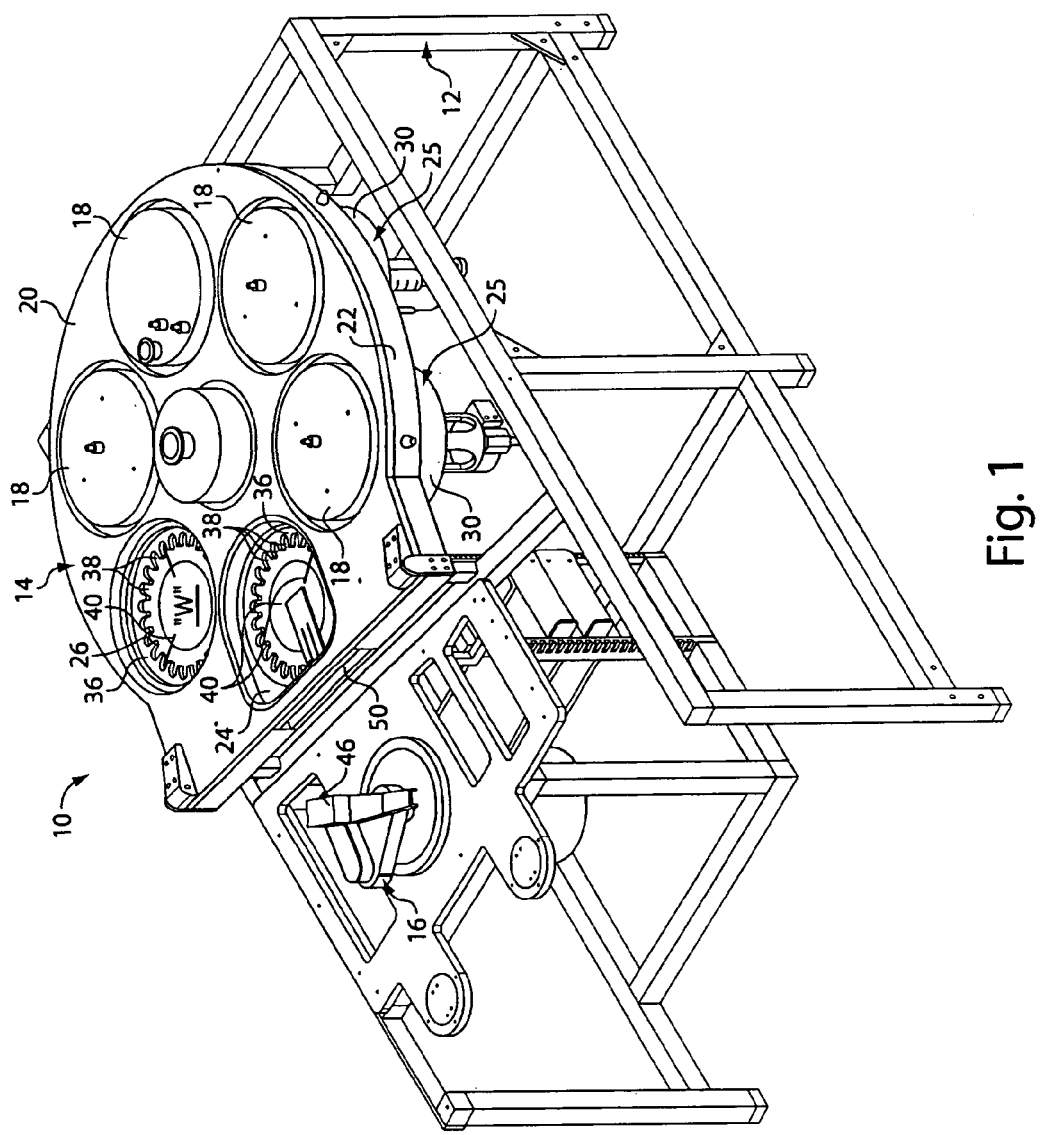
FIG. 1 is a perspective view of a cluster wafer processing equipment with a process table associated therewith arranged according to the principles of the present invention.

Referring now to the drawings in detail, and particularly to FIG. 1, there is shown the present invention which comprises a wafer processing arrangement 10 for the sequential isolated treatment processing of semiconductor wafers. The processing arrangement 10 comprises a frame support 12 for a wafer process table 14 and a wafer feed and removal robot arrangement 16 thereadjacent. The wafer process table 14 comprises a plurality of housing covers 18 each positioned on a stationary upper plate 20 as part of a treatment module for each position in the process of treatment of the semiconductor wafers. The housing cover 18 may be changable to permit changing of treatment of the wafers "W" as they go through the process described herein below.

The wafer process table 14 also includes a stationary lower housing platen 22 which surrounds a central transmission unit (not shown for clarity) which rotatively indexes a rotary index plate 24 between a plurality of treatment modules 25 which comprises the equipment effecting the sequential steps in the treatment process at the process table 14.

Figure 2:
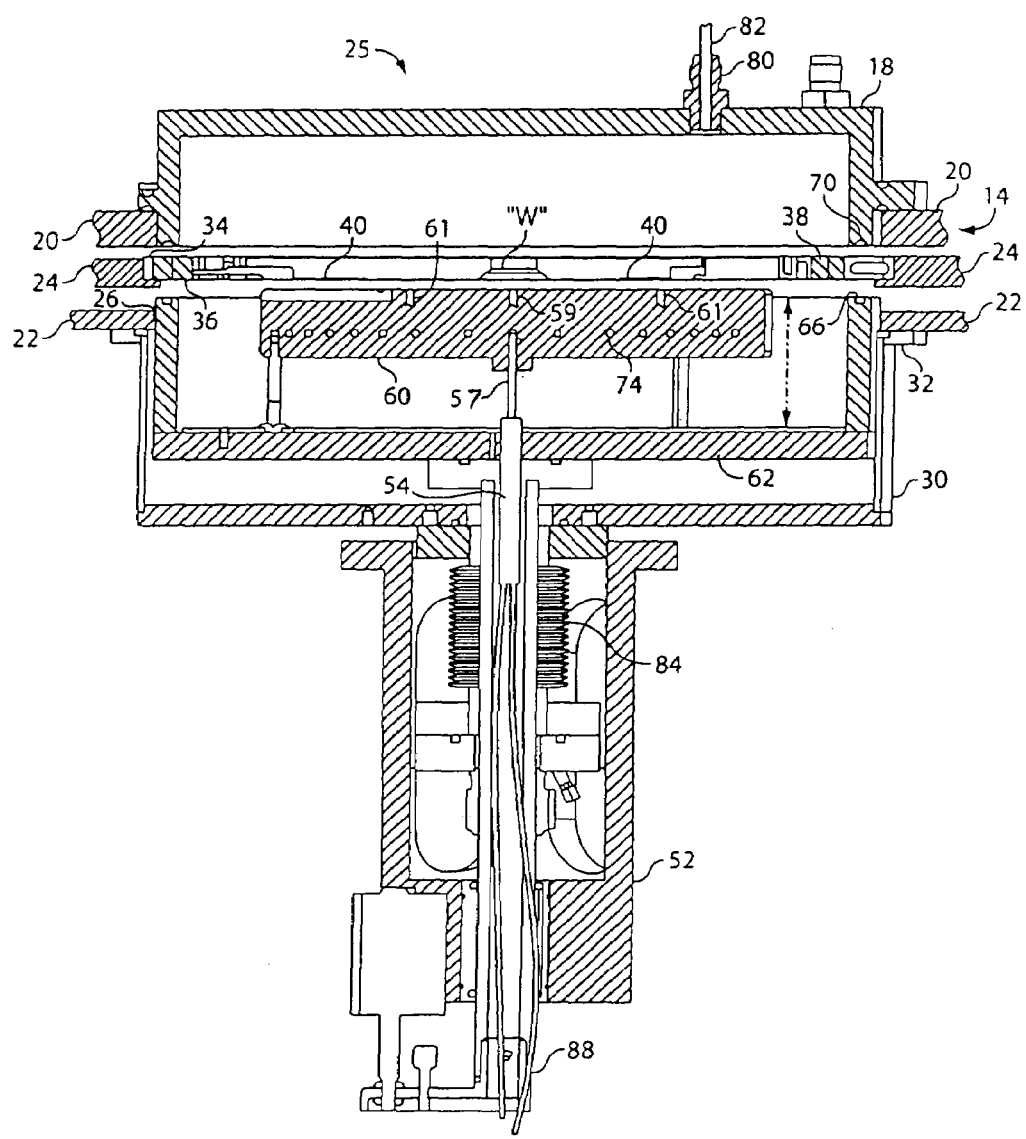
FIG. 2 is a side elevational view, in section, of a particular treatment module arranged on the processing table.
Figure 3:
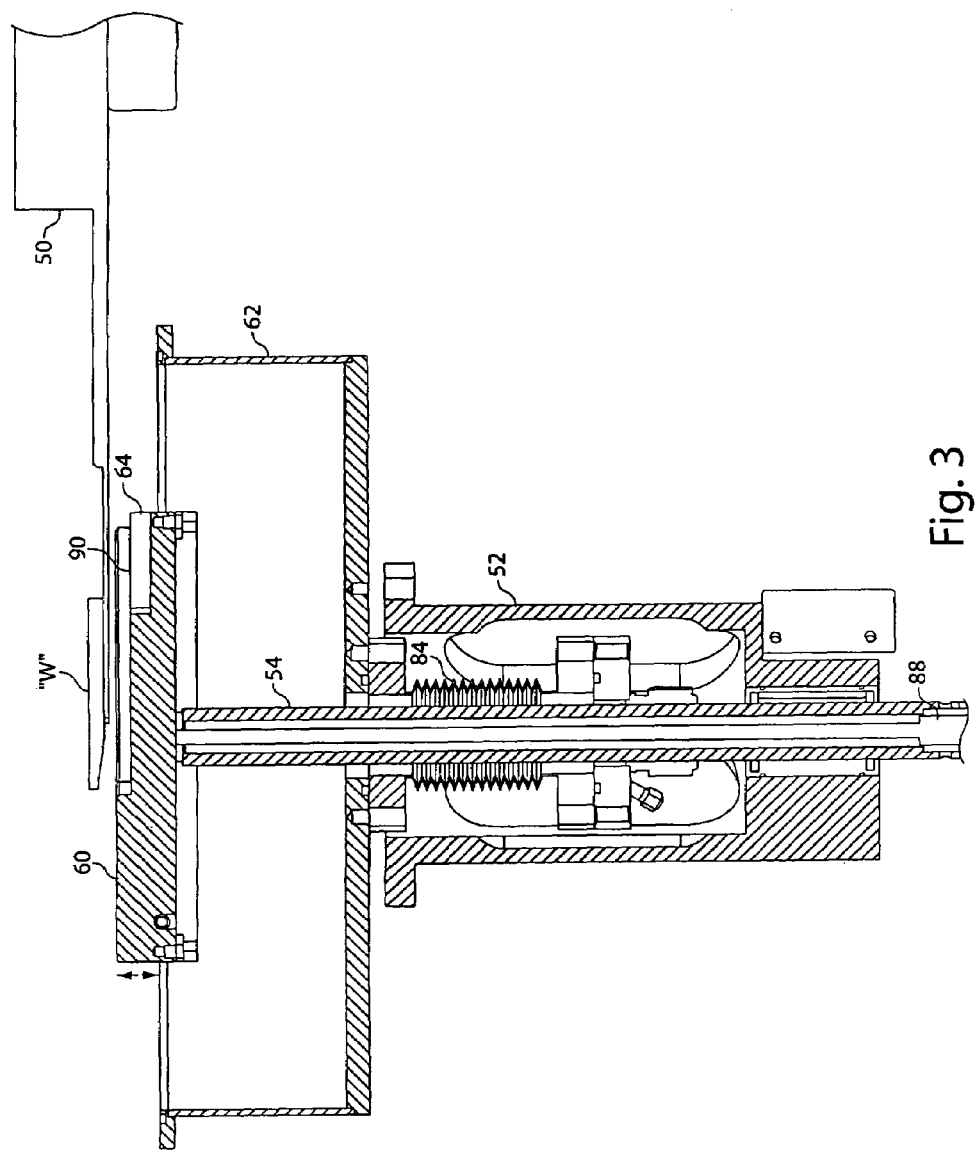
FIG. 3 is a view of a portion of the treatment module and the robotic arm associated therewith utilized for loading and unloading a semiconductor wafer from the treatment plate of that module.
Figure 4:
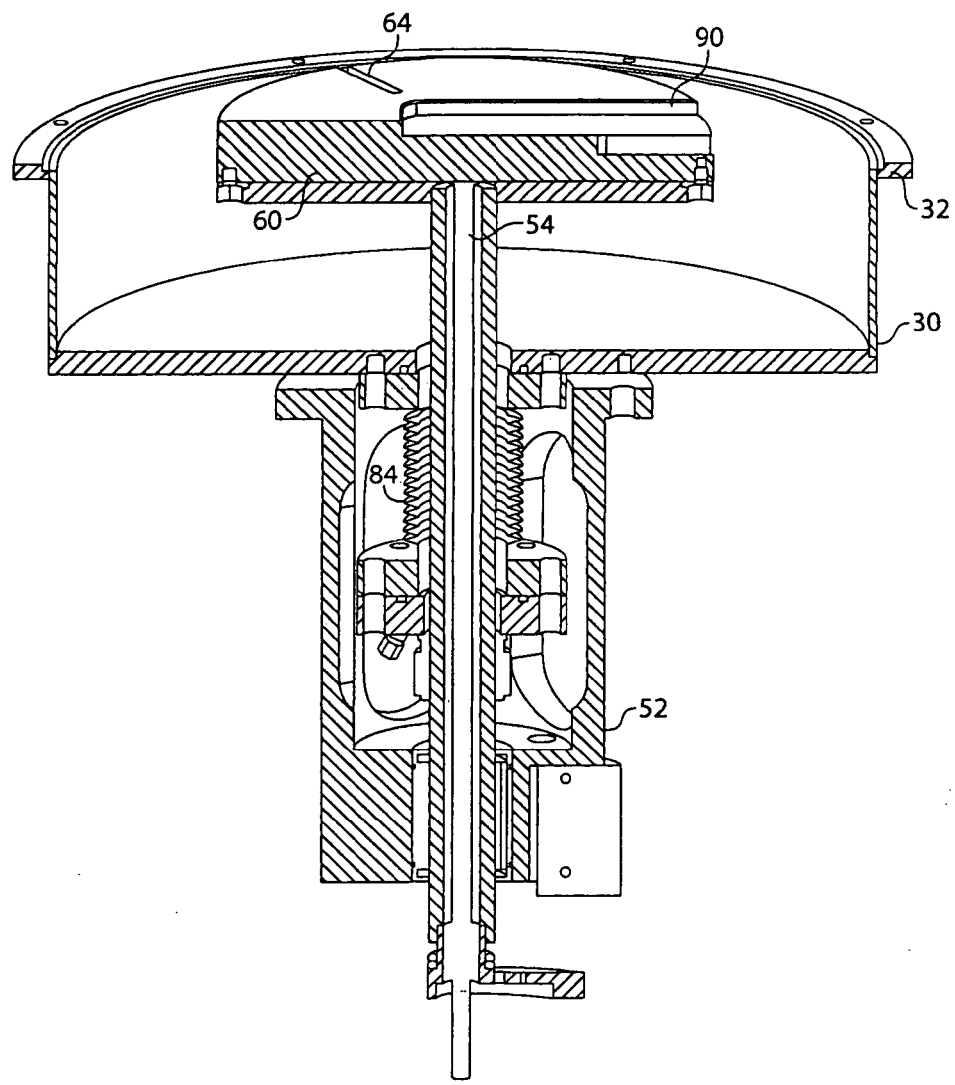
FIG. 4 is a perspective view, in section, of a lower portion of the treatment module and the treatment plate arranged therewithin.

Each step in the process is accomplished as the intermediately disposed rotary index plate 24 rotatively indexes through a series of positions, which positions register with the upper plate 20 and the housing covers 18 associated therewith, and the stationary lower housing platen 22 with its respective treatment modules 25, as represented in FIGS. 2, 3 and 4.

The stationary lower platen 22 includes for each position in the process, an opening 26 therethrough with a lower portion of the processing or treatment module 25 thereattached. The processing module 25 attached to the lower side of the stationary lower plate 22 consists of a lower cup or housing 30. The lower housing 30 has an upper edge 32 defined by an annular lip which is secured to the periphery of its respective opening 26 in the lower plate 22 of the process table 14. The lower plate 22 and the lower housing 30 is stationary with respect to the upper plate 14 of the process table 14 and the frame 12.

The intermediate rotary indexing plate 24 is arranged between the upper plate 20 of the process table 14 and the lower plate 22 supporting the outer lower cup shaped housing 30 at each processing module 25 therearound. The rotary indexing plate 24 has spaced apart openings 34 on which an annular, vertically liftable wafer ring 36 is disposed. Each annular wafer ring 36 has a plurality of circumferentially spaced openings 38 therethrough to provide a fluid communication between the stationary upper chamber 18 at each processing or treatment module 25 and the outer lower housing 30 of each processing module 25. Each wafer ring 36 has at least three radially inwardly directed wafer support pins 40 extending therefrom, as best represented in FIG. 2. Each support pin 40 has a shoulder thereon to provide lateral support for a wafer "W" carried by those pins 40. As the rotary index plate 24 advances rotationally from treatment module 25 to next adjacent treatment module 25 in sequence around the wafer processing table 14, a robotic arm 46, best represented in FIG. 3, loads and unloads the semiconducter wafer "W" at the proper loading and unloading station 50 in the sequence. The wafer "W" is placed upon the upper side of the wafer support pins 40 which extend radially inwardly from the inner edge of the wafer ring 36, as shown in FIG. 2. The shoulders (not shown for clarity) on those pins 40 provides lateral support as the wafers "W" are rotatively indexed between adjacent treatment or processing modules.

Each processing module 25 has a lower support housing 52 associated therewith. The lower support housing 52 includes a support column 54 extending therethrough, as represented in FIGS. 2, 3 and 4. A wafer treatment plate 60 is arranged on the upper end of the support column 54 extending through the support housing 52. The treatment plate 60 is arranged with a correspondingly vertically displacable isolation chamber 62. The support column 54 moves both the isolation chamber 62 and the treatment plate 60 arranged therewithin, into a vertical supportive contact with a semiconductor wafer "W" held by the wafer support pins 40 extending radially inwardly from the wafer ring 36. The treatment plate 60, preferably of circular configuration, has a corresponding radially inwardly directed grooves 64 arranged therein, (only one being shown in FIG. 2 and one shown in FIG. 4) for spaced yet non-touching "enclosive" receipt of the respective radially inwardly directed wafer support pins 40. As the treatment plate 60 is moved vertically upwardly, it contacts and lifts the wafer "W" slightly away from the wafer support pins 40 to permit full supportive touching engagement of the treatment plate 60 by slight displacement from the wafer support pins 40.

During this part of the process, each of the respective isolation chambers 25, each of which have an "O" ring 66 around its upper peripheral edge, engages the lower side of the wafer ring 36. The lower peripheral edge 68 of the inverted upper chamber 18 also has an "O" ring 70 therearound. As the treatment plate 60 is driven upwardly and the "O" rings 66 and 70 press against the lower and upper sides of the wafer ring 36, and the wafer ring 36 may be lifted slightly to provide a tight abutting relationship between the inverted upper chamber 18, the wafer ring 36 and the periphery of the lower isolation housing 62 wherein an "isolation chamber" is thus formed between the stationary upper chamber 18 and the upwardly movable isolation housing 62 to permit the enclosed, isolated, controlled "serial" processing of a wafer "W" at that particular module 25 in the processing table 14 to go forward.

Figure 5:
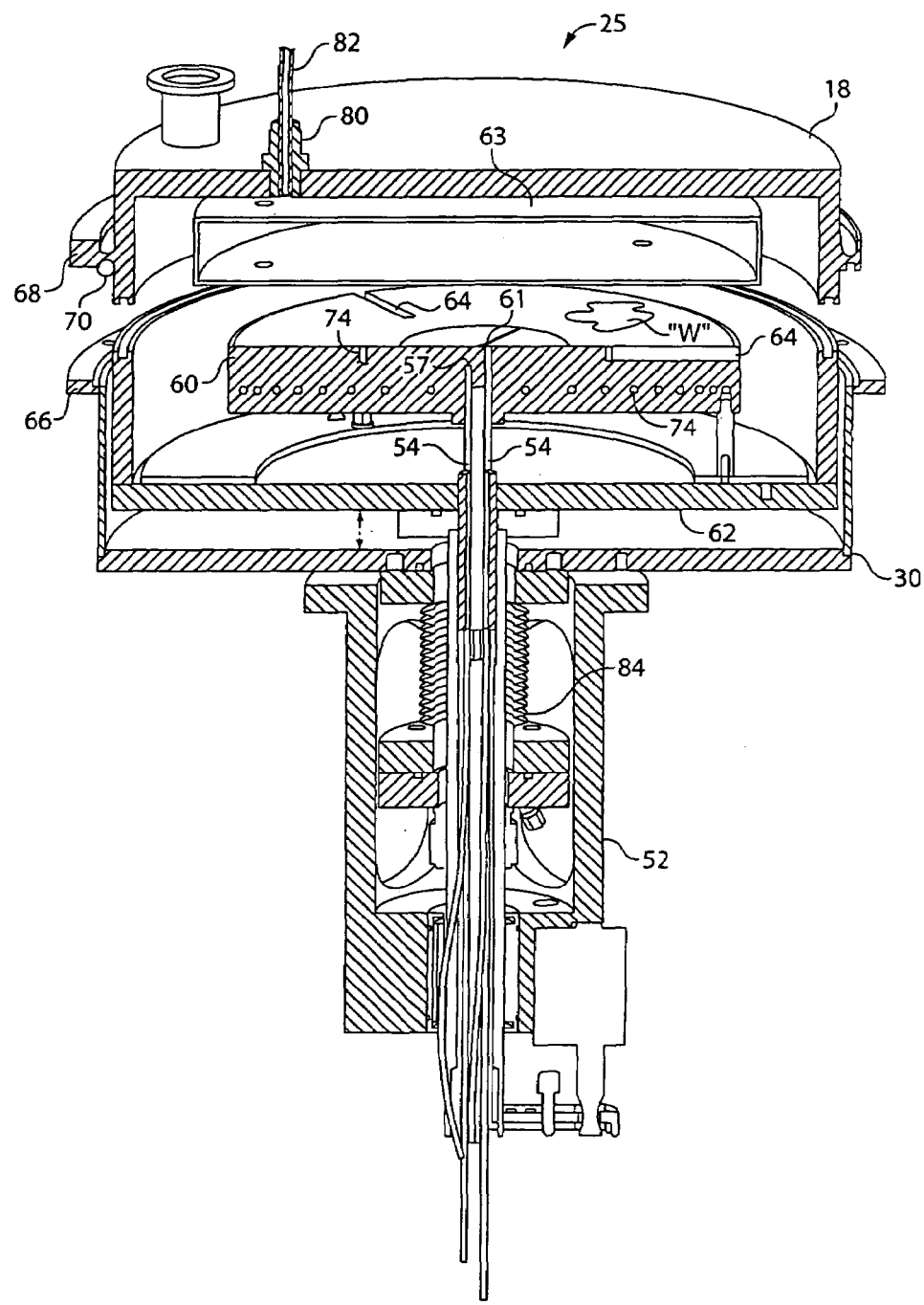
FIG. 5 is a view similar to FIG. 2, showing a further embodiment of the treatment module.

The treatment plate 60 may comprise heating elements or cooling elements, or temperature sensors 74 or the like, therewith, as represented in FIGS. 2 and 5. A casting tube 57 for sensing, and/or a vacuum line 59 or the like, may also be arranged through one or more orifices 61 in the plate 60 to more securely hold the wafer "W" to that plate 60. By this touching or "suctioned" engagement the more rapidly heat is transferred to the semiconductor wafer thereon or the more rapidly that semiconductor thereon is chilled, depending upon which position that particular semiconductor wafer is at in the process table 14 and whether the wafer "W" is to be heated or chilled or otherwise treated as necessary.

A treatment port 80 may be arranged through the stationary upper housing 18, as represented in FIG. 2, which port 80 is in fluid communication, through a treatment/vacuum conduit 82 to a proper source, not shown, or also, in a further preferred embodiment, a treatment apparatus 63 as shown in FIG. 5, to additionally or alternatively provide for example, a central vacuum directly to the isolation chamber, or to provide treatment such as for example: a magnetron, a chemical vapor deposition (CVD) or a physical vapor deposition (PVD), ion implantation, plasma deposition, lamp heating or UV treatment, or a combination thereof for treatment of that particular semiconductor wafer "W" at that particular treatment module 25 in the apparatus 10.

The support housing 52, beneath the outer lower housing 30 may include a bellows 84 to permit the longitudinal advancement and withdrawal of the support column 54 in the housing 52 while maintaining the ambient relationship within the isolation chamber comprised of the upper cup 18 and the lower isolation housing 62. A treatment plate and isolation housing lift and retraction mechanism 88 is also arranged within the support housing 52 to provide the vertical advance and vertical withdrawal of the treatment plate 60 from a semiconductor wafer "W" supported on the wafer support pins 40 on the wafer ring 36. Indexed rotational movement of the rotatable index plate 24 advances subsequent semiconductor wafers "W" to each respective treatment module for sequential treatment as that index plate 24 is rotated about its central axis. The robotic loading and unloading of semiconductor wafers occurs from a radially outwardly disposed location with respect to the process table 14, as shown in FIG. 1. This peripherally disposed wafer manipulation, instead of from a center of table location, permits simpler indexing mechanism and greatly simplifies the loading and unloading of the semiconductor wafers at that particular loading and unloading module location in the sequence at the process table.

The treatment plate has a radially directed channel 90 spaced at least partially thereacross, as shown in FIGS. 3 and 4. The depth of the channel 90 in the treatment plate 60 is greater than the depth of the grooves 64 for accommodating the wafer support pins 40 thereon. This permits the robotic loading and unloading arm 50 to move or remove a wafer "W" onto the radially directed support pins 40 and then subsequently downwardly therefrom to permit the support of that wafer "W" on those support pins 40 without disturbing that semiconductor wafer "W" and without engaging the treatment plate 60.

Thus what has been shown is an apparatus for the serial processing of semiconductor wafers from an initial loading of an indexable rotatable plate through a circumferential arrangement of locations at separate treatment modules thus through an unloading operation of that semiconductor wafer after its treatment process. Each independent treatment module effects an isolation chamber processing to permit ambient conditions to be effected upon that semiconductor wafer at that particular location in the process table. By this stepped indexing and complete isolation as each individual wafer is individually processed, treatment times may be minimized and treatment effectiveness may be maximized and equipment costs may be reduced due to the simplicity of the operational features of the present apparatus.

We claim:

1. A method of preparing semiconductor wafers, comprising:
    arranging a stationary upper platen and a stationary lower plate on a frame, with said upper platen having a plurality of upper housings spaced circumferentially therearound, and said lower plate having a corresponding plurality of lower housings spaced circumferentially therearound;
    rotatively supporting an indexable plate between said upper platen and said lower plate;
    loading a wafer to be treated onto an arrangement of support pins extending at least part way across said opening on said indexable plate;
    rotating said indexable plate between said upper platen and said lower plate for successive treatment process locations for treatment of said wafer; and
    isolating said wafer on said index plate at each treatment location for independent controlled access and treatment of said wafer thereat.

2. The method as recited in claim 1, including:
    lifting a treatment plate into direct supportive contact with said wafer to begin a step in said treatment of said wafer.

3. The method as recited in claim 2, including:
    arranging a plurality of grooves on said treatment plate to permit said pins to be received therewithin, to allow said wafer to be supportively touched by said treatment plate.

4. The method as recited in claim 1, including:
    arranging a lower isolation chamber within each of said lower housings;
    moving said lower isolation chamber with respect to said lower housing to define an isolated treatment module between said upper housing and said lower housing.

5. The method as recited in claim 4, including:
    moving said treatment plate and said lower isolation chamber simultaneously to initiate treatment of a wafer supported on said pins.

6. The method as recited in claim 5, including:
    heating said wafer in said isolated treatment module after said wafer has been lifted from said pins.

7. The method as recited in claim 6, including:
    chilling said wafer in said isolated treatment module after said wafer has been lifted from said pins.

8. The method as recited in claim 5, including:
    introducing a further treatment to said wafer at a successive isolated treatment module after said treatment plate has been lowered from support of said wafer and said index plate has been rotated to a subsequent position between said stationary upper platen and said stationary lower plate.

9. A method of preparing semiconductors, comprising:
    rotating a wafer bearing indexing plate into alignment between an upper housing on a stationary upper platen and a lower housing on a stationary lower plate;
    lifting a treatment plate into supportive engagement with said wafer borne by said indexing plate;
    isolating said wafer to provide an individual sealed containment thereof during a treatment process applied to said wafer;
    loading said wafer onto said indexing plate by a robotic arm arranged radially outwardly of said indexing plate, to minimize the complexity of such loading;
    suctioning said wafer against said treatment plate by a vacuum arranged within said treatment plate; and
    placing a wafer ring onto said indexing plate to support said wafer on said indexing plate; and arranging a plurality of radially directed pins on said wafer ring to support said wafer within said wafer support ring.

10. The method as recited in claim 9, including:
    lifting said wafer support ring from said indexing plate to properly engage said wafer by said treatment plate.

11. The method as recited in claim 9, including:
    arranging an opening on said indexing plate for receipt of said wafer;
    placing a plurality of radially directed pins on the periphery of said opening, to enable said pins to support said wafer during rotation of said indexing plate.

12. The method as recited in claim 9, including:
    forming grooves on an upper surface of said treatment plate to permit said pins to be received therein to allow said treatment plate to directly touch and support said wafer during treatment thereof.

13. The method as recited in claim 9, including:
    enclosing said treatment plate in a displacable lower isolation chamber; and
    moving said lower isolation chamber into sealing engagement with said indexing plate as said treatment plate is lifted into supportive engagement with said wafer.

* * * * *